United States Patent [19]

Sakaguchi

[11] Patent Number: 5,068,659

[45] Date of Patent: Nov. 26, 1991

[54] DELTA-SIGMA MODULATION ANALOG TO DIGITAL CONVERTER

[75] Inventor: Takashi Sakaguchi, Kanagawa, Japan

[73] Assignee: Kabushiki Kaisha Toshiba, Kanagawa, Japan

[21] Appl. No.: 568,189

[22] Filed: Aug. 16, 1990

Related U.S. Application Data

[63] Continuation of Ser. No. 322,867, Mar. 14, 1989, Pat. No. 4,994,804.

[30] Foreign Application Priority Data

Mar. 15, 1988 [JP] Japan .................................. 63-61595

[51] Int. Cl.5 .............................................. H03M 3/02
[52] U.S. Cl. ....................................... 341/143; 375/28
[58] Field of Search ................ 341/143, 155, 166–170, 341/200; 375/27–34

[56] References Cited

U.S. PATENT DOCUMENTS

4,837,527 6/1989 Sauer .................................. 375/28 X
4,896,156 1/1990 Garverick ........................... 341/143

Primary Examiner—J. R. Scott
Assistant Examiner—Sharon D. Logan
Attorney, Agent, or Firm—Finnegan, Henderson, Farabow, Garrett, and Dunner

[57] ABSTRACT

A delta-sigma modulation analog to digital converter for converting an analog input signal to a digital output signal. The converter includes an input circuit for receiving the analog input signal, a clock generator for generating a very high frequency clock signal with first and second phases, a first switching circuit coupled to the input circuit for modulating the analog input signal with the very high frequency clock signal, an integration circuit coupled to the first switching circuit for integrating the modulated input signal and generating a noise signal, a second switching circuit coupled to the integration circuit both for demodulating the integrated modulated input signal and modulating the noise signal with the very high frequency clock signal, a quantizing circuit coupled to the second switching circuit and responsive to the demodulated input signal and the modulated noise signal for generating the digital output signal including a separable portion corresponding to the modulated noise signal and a feedback circuit coupled between the quantizing circuit and the integration circuit both for generating a feedback signal corresponding to the digital output signal and feeding the feedback signal to the integration circuit.

16 Claims, 7 Drawing Sheets

DELTA-SIGMA MODULATION ANALOG TO DIGITAL CONVERTER

This is a continuation of application Ser. No. 07/322,867, filed March 14, 1989, now U.S. Pat. No. 4,994,804.

FIELD OF THE INVENTION

The present invention relates generally to an analog to digital converter, and more particularly, to a delta-sigma modulation analog to digital converter.

BACKGROUND OF THE INVENTION

Conventionally, an analog to digital converter (referred to as A/D converter hereafter,) such as an analog to digital converter or a digital to analog converter is used in many fields. In particular, an over-sampling type delta-sigma modulation A/D converter is widely used, because the converter is suitable for reducing circuit size, making a circuit into Large Scale Integration circuit (LSI) or increasing the operational speed of circuits. This type of A/D converter is generally referred to as a delta-sigma modulation A/D converter or a $\Delta-\Sigma$ modulation A/D converter.

Figure 1:
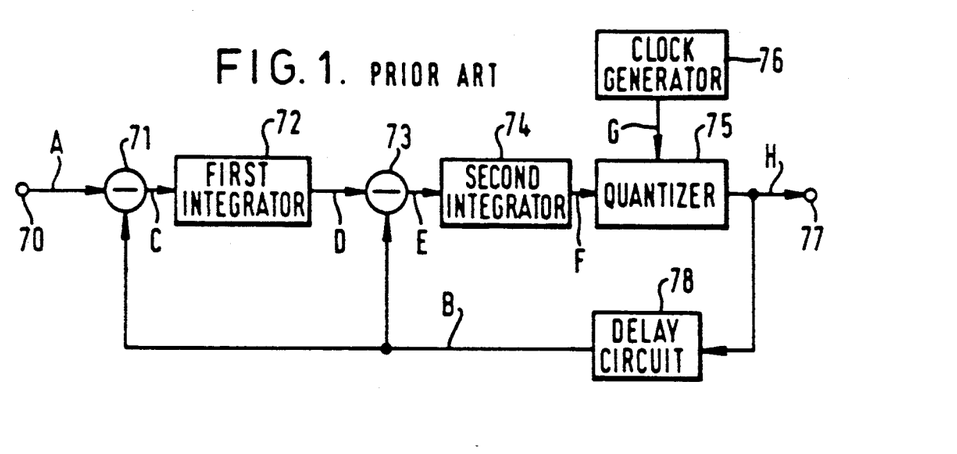
FIG. 1 is a block diagram showing a typical Δ−Σ modulation A/D converter.

FIG. 1 shows a circuit diagram of a typical $\Delta-\Sigma$ modulation A/D converter. In FIG. 1, an analog signal A to be quantized is applied to a first substractor 71 through an input terminal 70. The first substractor 71 carries out a substraction operation between the analog signal A and a feedback signal B, which will be described later. A first subtraction signal C ($C=B-A$) obtained by the first substractor 71 is applied to a first integrator 72.

The first integrator 72 carries out an integration operation for the first substraction signal C. A first integration signal D obtained by the first subtractor 71 is applied to a second substractor 73. The second subtractor 73 carries out a substraction operation between the first integration signal D and the feedback signal B. A second substraction signal E obtained by the second subtractor 73 is then applied to a second integrator 74. The second integrator 74 carries out an integration operation for the second subtraction signal E. A second integration signal F obtained by the second integrator 74 is applied to a quantizer 75. The quantizer 75 carries out a quantization operation for the second integration signal F.

The quantizer 75 has a comparator (not shown) for comparing the second integration signal F with a reference potential in every cycle of a clock signal G. The clock signal G is generated by a clock generator 76. The clock signal G has a frequency sufficiently higher than the highest frequency component of the analog signal A.

The clock signal G operates as a sampling signal for the quantizing operation carried out in the quantizer 75. The second integration signal F is sampled at a rate of the frequency of the clock signal G. A sampled instantaneous signal value of the second integration signal F obtained by the quantizer 75 is output to an output terminal 77 as a quantization signal H of the analog signal A as described later.

The sampled instantaneous signal value is applied to a delay circuit 78 so that the above-mentioned feedback signal B is obtained. The feedback signal B is fed back in the signal flow-path including the first and second integrators 72 and 74 and the quantizer 75. The sampled instantaneous signal values are integrated, re-sampled and again integrated to reduce quantizing noise in the feedback loop. Thus, the output H obtained from the quantizer 75 is converted to a one bit digital signal version.

Furthermore, the feedback signal B, i.e., the feedback sampled instantaneous signal value is influenced or modulated by the input analog signal A according to the subtraction operation of the first substraction circuit 71. Thus, the one bit digital signal version output H also has a Pulse Code Modulation (PCM) or a Pulse Density Modulation (PDM) version of the analog signal A.

Figure 2:
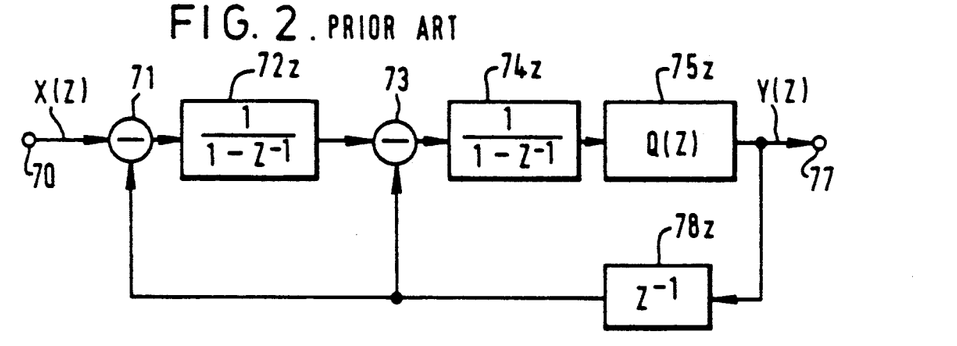
FIG. 2 is a block diagram showing an equivalent circuit of the A/D converter of FIG. 1.

The $\Delta-\Sigma$ modulator of FIG. 1 is so-called as a double integration type $\Delta-\Sigma$ modulator. This type of $\Delta-\Sigma$ modulator can be represented by an equivalent circuit as shown in FIG. 2, according to the Z-translation. In FIG. 2, circuit blocks 72z and 74z with the translation formula $1/(1-Z^{-1})$ correspond to the first and second integration circuits 72 and 74 of FIG. 1. A circuit block 75z with the translation formula Q(Z) corresponds to the quantizer 75 of FIG. 1. A circuit block 78z with the translation formula $Z^{-1}$ corresponds to the delay circuit 78 of FIG. 1. According to the equivalent circuit of FIG. 2, an input analog signal X(Z) is converted to a digital output Y(Z), while a quantizing noise Q(Z) occurs in the quantizer circuit block 75z.

The equivalent circuit of FIG. 2 has a transfer function as below;

$$Y(Z)=X(Z)+(1-Z^{-1})^2\cdot Q(Z) \tag{1}$$

Equation (1) represents that the digital output Y(Z) comprises a first component which responds to the analog signal X(Z) and a second component which corresponds to the quantizing noise Q(Z). The first component X(Z) has a uniform frequency response characteristic while the second component $(1-Z^{-1})^2\cdot Q(Z)$ has a frequency response characteristic of which a response abruptly increases in response to the increase of the frequency. However, the second component $(1-Z^{-1})^2\cdot Q(Z)$ is small in comparison to the first component X(Z), if the frequency of the clock signal G is sufficiently higher than the highest frequency component of the analog signal X(Z). Further, the second component $(1-Z^{-1})^2\cdot Q(Z)$ can be removed easily by using a low pass filter.

As described above, the double integration type $\Delta-\Sigma$ modulator can quantize an analog signal theortically with a very high quantizing accuracy. However, an A/D converter, such as the double integration type $\Delta-\Sigma$ modulator, still has another noise problem. That is, every circuit block of the A/D converter produces an internal noise, e.g., thermal noise. An external noise, e.g., noise included in a power source (referred to as power source noise hereafter) for driving the A/D converter is also introduced in the A/D converter. Further, noise included in an analog signal to be quantized (referred to as signal source noise hereafter) is introduced in the A/D converter. These noises are processed in the same manner as an analog signal X(Z) to be quantized by the A/D converter. Thus, the noises' except the quantizing noise and the signal source noise, are very difficult to remove from the digital output Y(Z).

SUMMARY OF THE INVENTION

It is, therefore, an object of the present invention to provide a Δ−Σ modulation A/D converter which can reduce noise.

In order to achieve the above object, a Δ−Σ modulation A/D converter according to one aspect of the present invention includes an input circuit for receiving the analog input signal, a clock generator for generating a very high frequency clock signal with first and second phases, a first switching circuit coupled to the input circuit for modulating the analog input signal with the very high frequency clock signal, an integration circuit coupled to the first switching circuit for integrating the modulated input signal and generating a noise signal, a second switching circuit coupled to the integration circuit both for demodulating the integrated modulated input signal and modulating the noise signal with the very high frequency clock signal, a quantizing circuit coupled to the second switching circuit and responsive to the demodulated input signal and the modulated noise signal for generating the digital output signal including a separable portion corresponding to the modulated noise signal and a feedback circuit coupled between the quantizing circuit and the integration circuit both for generating a feedback signal corresponding to the digital output signal and feeding the feedback signal to the integration circuit.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to the FIGS. 3 through 9. Throughout drawings, reference numerals or letters used in FIG. 1 will be used to designate like or equivalent elements for simplicity of explanation.

Figure 3:
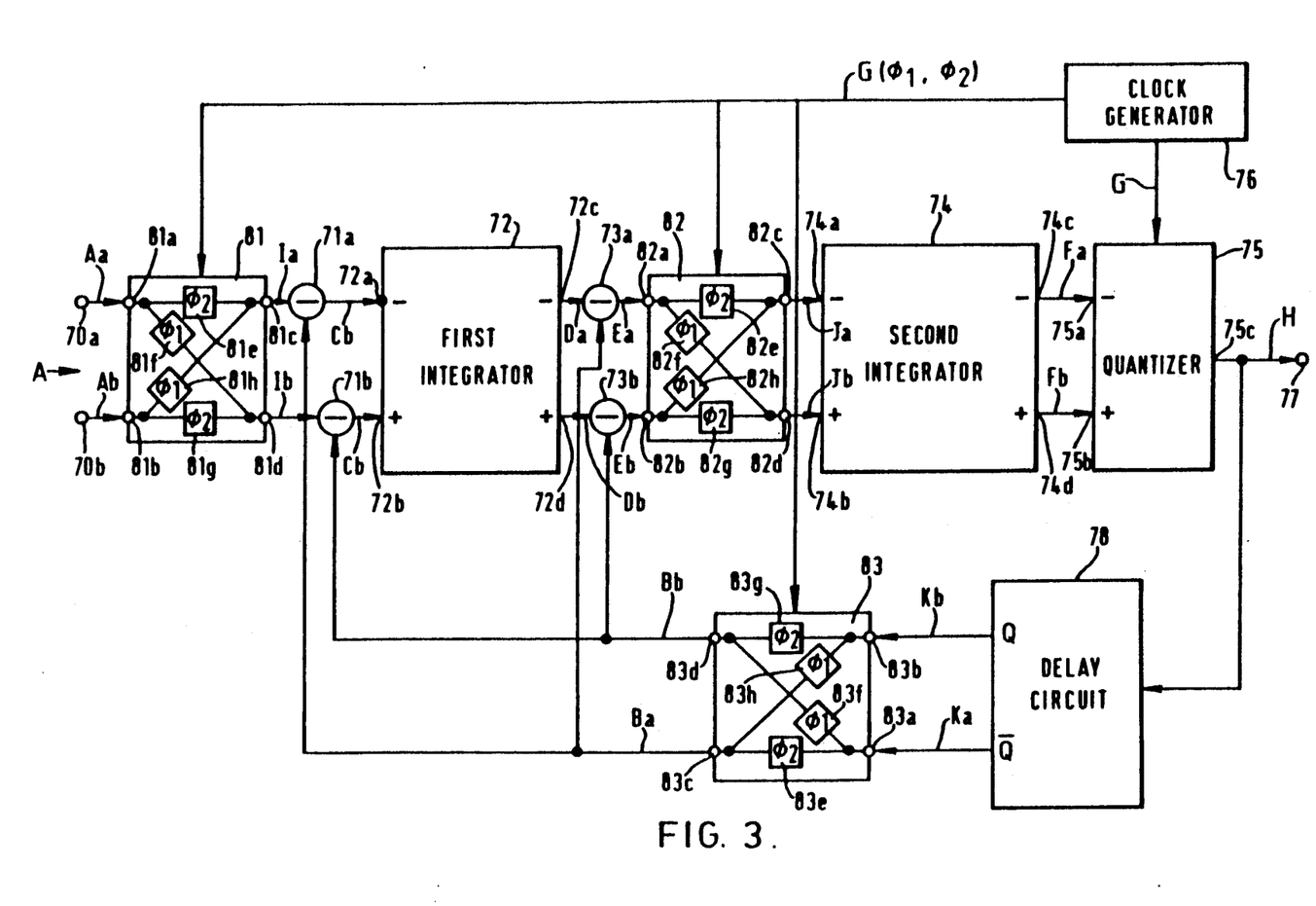
FIG. 3 is a block diagram showing a first embodiment of a Δ−Σ modulation A/D converter according to the present invention.

Referring now to FIG. 3, a first embodiment of the Δ−Σ modulation A/D converter according to the present invention will be described in detail. In FIG. 3, an analog signal A to be quantized is applied across first and second input terminals 70a and 70b. Thus, differentially related signals Aa and Ab of the analog signal A occur on the terminals 70a and 70b. The differentially related signals Aa and Ab are applied to a first switching circuit 81. The first switching circuit 81 has first and second input terminals 81a and 81b and first and second output terminals 81c and 81d. The switching operation of the first switching circuit 81 is controlled by a clock signal G. The clock signal G is generated by a clock generator 76. The switching operation of the first switching circuit 81 alternates between two switching states SS1 and SS2 according to the clock signal G as described later.

Switching output signals Ia and Ib are obtained from the first and second output terminals 81c and 81d of the first switching circuit 81. The switching output signals Ia and Ib are common signals the polarities of which are opposite to each other. The common signal will be represented by a first common switching output signal I. The first common switching output signal I is applied to first and second subtractors 71a and 71b. That is, the switching output signals Ia and Ib are applied to first and second subtractors 71a and 71b. The first substractor 71a carries out a subtraction operation between the signal Ia output from the output terminal 81c and a first feedback signal Ba. The second subtractor 71b carries out a subtraction operation between the signal Ib output from the output terminal 81d and a second feedback signal Bb. The first and second feedback signals Ba and Bb will be described later.

First and second subtraction signals Ca (Ca=Ba−Ia) and Cb (Cb=Bb−Ib) are obtained from the first and second subtractors 71a and 71b. The first and second subtraction signals Ca and Cb are common signals, the polarities of which are opposite to each other. The common signal will be represented by a first common subtraction signal C. The first common subtraction signal C is applied to a first integrator 72. That is, the first and second subtraction signals Ca and Cb are applied across inversed and non-inversed input terminals 72a and 72b of the first integrator 72.

The first integrator 72 carries out an integration operation for the first and second subtraction signals Ca and Cb. Then, the first integrator 72 outputs a first integration signal D through its inversed and non-inversed output terminals 72c and 72d. The inversed signal Da of the first integration signal D output from the inversed output terminal 72c is applied to a third subtractor 73a. The non-inversed signal Db of the first integration signal D output from the non-inversed output terminal 72d is applied to a fourth subtractor 73b.

The third subtractor 73a carries out a subtraction operation between the first inversed integration signal Da output from the inversed output terminal 72c and the first feedback signal Ba. The fourth subtractor 73b carries out a subtraction operation between the first non-inversed integration signal Db output from the non-inversed output terminal 72c and the second feedback signal Bb.

Third and fourth subtraction signals Ea (Ea=Ba−Da) and Eb (Eb=Bb−Db) are obtained from the third and fourth subtractors 73a and 73b. The third and fourth subtraction signals Ea and Eb are common signals, the polarities of which are opposite to each other. The common signal will be represented by a second common subtraction signal E. The second common subtraction signal E is applied to a second switching circuit 82. The second switching circuit 82 has a construction the same as the first switching circuit 81. Further, the switching operation of the second switching circuit 82 is controlled by the clock signal G similar to the operation of the first switching circuit 81. That is, the third and fourth subtraction signals Ea and Eb are applied to first and second input terminals 82a and 82b of the second switching circuit 82. Then, third and fourth switching output signals Ja and Jb are obtained from first and second output terminals 82c and 82d of the second switching circuit 82.

The third and fourth switching output signals Ja and Jb are applied across inversed and non-inversed input terminals 74a and 74b of a second integrator 74.

The second integrator 74 carries out an integration operation for the third and fourth subtraction signals Ja and Jb. Then, the second integrator 74 outputs a second integration signal F through its inversed and non-inversed output terminals 74c and 74d. The inversed signal Fa of the second integration signal F is output from the inversed output terminal 74c. The non-inversed signal Fb of the second integration signal F is output from the non-inversed output terminal 74d. The second integration signal F is applied to a quantizer 75. That is, the inversed signal Fa of the second integration signal F is applied to the inversed input terminal 75a of the quantizer 75. The non-inversed signal Fb of the second integration signal F is applied to the non-inversed input terminal 75b of the quantizer 75.

The quantizer 75 has a comparator (not shown) for comparing the second integration signal F with a reference potential in every cycle of the clock signal G. Thus, the clock signal G operates as a sampling clock signal. The clock signal G has a frequency sufficiently higher than the highest frequency component of the analog signal A. The second integration signal F is sampled at a rate of the frequency of the clock signal G. A sampled instantaneous signal value of the second integration signal F obtained by the quantizer 75 is output from the output terminal 75c of the quantizer 75. The sampled signal is applied to an output terminal 77 of the A/D converter as a quantization signal H of the analog signal A, as described later.

The quantization signal H obtained by the quantizer 75 is applied to a delay circuit 78. The delay circuit 78 delays the quantization signal H for a prescribed period. The delay circuit 78 outputs first and second delayed signals Ka and Kb from its Q and Q output terminals. The first and second delayed signals Ka and Kb are common signals differentially related to each other. The common signal will be represented by a common delayed signal K. The common delayed signal K is applied to a third switching circuit 83. The third switching circuit 83 has a construction the same as the first and second switching circuits 81 and 82. Further, the switching operation of the third switching circuit 83 is controlled by the clock signal G similar to the operation of the first and second switching circuits 81 and 82.

The first and second delayed signals Ka and Kb are applied to first and second input terminals 83a and 83b of the third switching circuit 83. Then, fifth and sixth switching output signals are obtained from first and second output terminals 83c and 83d of the third switching circuit 83. The fifth switching output signal is applied to the first and third subtractors 71a and 73a as the first feedback signal Ba. The sixth switching output signal is applied to the second and fourth subtractors 71b and 73b as the second feedback signal Bb.

Now the first, second and third switching circuits 81, 82 and 83 will be described in detail. Each of the circuits 81, 82 and 83 have the same circuit construction as described above. Thus, the description of the first switching circuit 81 will be representative of all three switching circuits. The first switching circuit 81 includes four switches 81e through 81h. The first switch 81e is coupled between the first input terminal 81a and the first output terminal 81c of the first switching circuit 81. The second switch 81f is coupled between the first input terminal 81a and the second output terminal 81d of the first switching circuit 81. The third switch 81g is coupled between the second input terminal 81b and the second output terminal 81d of the first switching circuit 81. The fourth switch 81h is coupled between the second input terminal 81b and the first output terminal 81c of the first switching circuit 81.

The switches 81e through 81h are turned ON or OFF by the clock signal G. Now the clock signal G is assumed to be comprised of two signals $\phi 1$ and $\phi 2$ which are opposite in phase to each other. That is, the clock generator 76 generates first and second phase clock signals $\phi 1$ and $\phi 2$. Each of the first and second phase clock signals $\phi 1$ and $\phi 2$ changes between two logic levels H and L in the predetermined frequency but in opposite phase to each other. Further, the first and second phase clock signals $\phi 1$ and $\phi 2$ are related to each other so that their H level periods do not overlap with each other.

The first and third switches 81e and 81g are controlled by the second phase clock signal $\phi 2$. On the other hand, the second and fourth switches 81f and 81h are controlled by the first phase clock signal $\phi 1$. Then, the first and third switches 81e and 81g are turned ON when the second phase clock signal $\phi 2$ is in the H level. On the other hand, the second and fourth switches 81f and 81h are turned OFF at the time. As a result, the signals Aa and Ab of the analog signal A applied to the first and second input terminals 81a and 81b of the first switching circuit 81 are led to the first and second output terminals 81c and 81d through the first and third switches 81e and 81g, respectively. The state is now assumed to correspond to the switching state SS1, as mentioned before.

The second and fourth switches 81f and 81h are turned ON when the first phase clock signal $\phi 1$ is in the H level. On the other hand, the first and third switches 81e and 81g are turned OFF at the time. As a result, the signals Aa and Ab of the analog signal A applied to the first and second input terminals 81a and 81b of the first switching circuit 81 are led to the second and first output terminals 81d and 81c through the second and fourth switches 81f and 81h, respectively. The state corresponds to the switching state SS2.

Therefore, the first switching circuit 81 leads the signals Aa and Ab of the analog signal A to the first and second output terminals 81c and 81d in the first state SS1. On the other hand, the first switching circuit 81 leads the signals Aa and Ab of the analog signal A to the second and first output terminals 81d and 81c in the second state SS2.

The second and third switching circuits 82 and 83 are constructed as the same as the first switching circuit 81, as described before. Therefore, the second switching circuit 82 leads the third and fourth subtraction signals Ea and Eb to the first and second output terminals 82c and 82d in the first state SS1. On the other hand, the second switching circuit 81 leads the third and fourth subtraction signals Ea and Eb to the second and first output terminals 82d and 82c in the second state SS2. The third switching circuit 83 also leads the first and second delayed signals Ka and Kb to the first and second output terminals 83c and 83d in the first state SS1. On the other hand, the third switching circuit 83 leads the first and second delayed signals Ka and Kb to the second and first output terminals 83d and 83c in the second state SS2.

Now the operation of the first embodiment of the A/D converter, as shown in FIG. 3, will be described. The switching operations of the first, second and third switching circuits 81, 82 and 83 change between the first and second states SS1 and SS2 in response to the first and second phase clock signals $\phi 1$ and $\phi 2$, as described above. According to the switching operation, a signal related to the input analog signal Aa flows into the inversed input terminal 75a of the quantizer 75 through a signal flow-path including the first and third subtractors 71a and 73a and then fed back to the first subtractor 71a in the first switching state SS1. While, another signal related to the signal Ab flows into the non-inversed input terminal 75b of the quantizer 75 through another signal flow-path including the second and fourth subtractors 71b and 73b and then fed back to the first subtractor 71b in the second switching state SS2.

As a result, the signals in the A/D converter of FIG. 3 change their signal flow-paths at the frequency of the clock signal G. The switching operations carried out by the first, second and third switching circuits 81, 82 and 83 are equivalent to a multiplication process. That is, the first switching circuit 81 operates as a multiplier for multiplying the analog signal A with the clock signal G. The second switching circuit 82 operates as a multiplier for multiplying the second common subtraction signal E with the clock signal G. The third switching circuit 83 operates as a multiplier for multiplying the common delayed signal K with the clock signal G.

Figure 4:
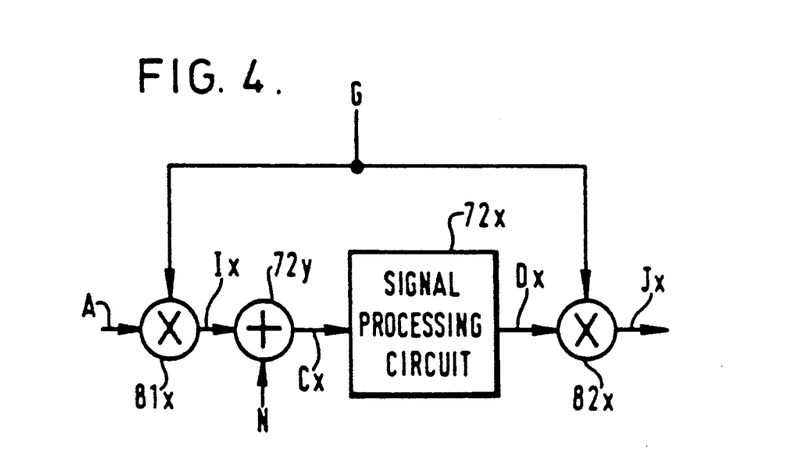
FIG. 4 is a block diagram showing an equivalent circuit of a part of the A/D converter of FIG. 3.

Referring now to FIG. 4 and FIGS. 5(a) through 5(f), the switching operation or the multiplication carried out in the A/D converter of FIG. 3 will be described. FIG. 4 shows an equivalent circuit of a part of the A/D converter of FIG. 3. FIGS. 5(a) through 5(f) show waveform diagrams of signals in the equivalent circuit of FIG. 4.

In FIG. 4, the analog signal A is applied to a first multiplication circuit 81x. The first multiplication circuit 81x corresponds to the first switching circuit 81 in FIG. 3. The clock signal G is also applied to the first multiplication circuit 81x. Thus, the first multiplication circuit 81x multiplies the analog signal A with the clock signal G.

Figure 5A:
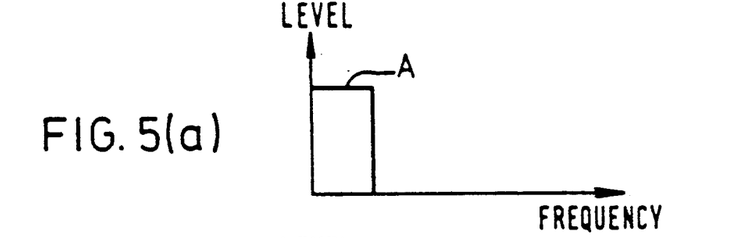
FIG. 5(a) through 5(f) are waveform diagrams showing signals in the equivalent circuit of FIG. 4.
Figure 5B:
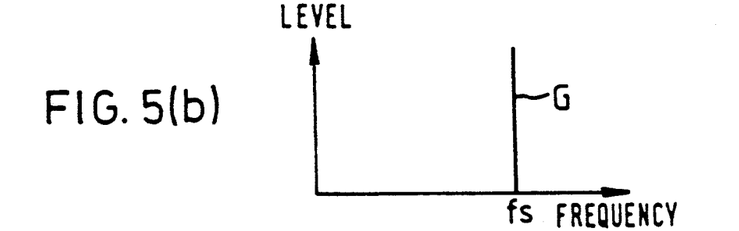
Figure 5C:
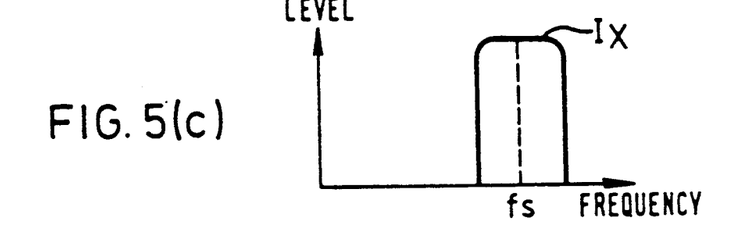

According to the multiplication, the analog signal A is modulated by the clock signal G. The analog signal A is assumed to have a frequency band, as shown in FIG. 5(a). The clock signal G is assumed to have a frequency higher than the analog signal, as shown in FIG. 5(b). The analog signal A, as shown in FIG. 5(a), is modulated by the clock signal G, as shown in FIG. 5(b), so that a modulated signal Ix, as shown in FIG. 5(c), is obtained from the first multiplication circuit 81x. In FIGS. 5(b) and 5(c), fs represents the frequency of the clock signal G.

The modulated signal Ix is applied to a signal processing circuit 72x through a noise source 72y. The signal processing circuit 72x corresponds to a circuit including the first and second subtraction circuits 71a and 71b, the first integrator 72 and the third and fourth subtraction circuits 73a and 73b. A noise signal N generated by the noise source 72y mainly represents a thermal noise produced in the first integrator 72. The noise signal N typically has a frequency response, as shown in FIG. 5(d).

Figure 5D:
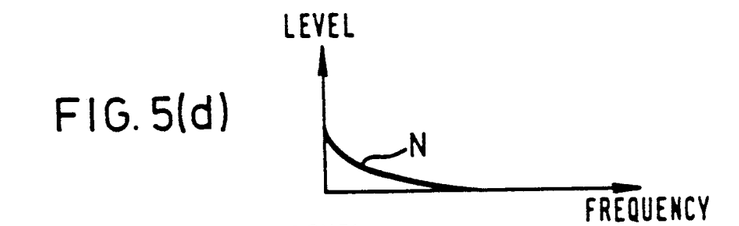
Figure 5E:
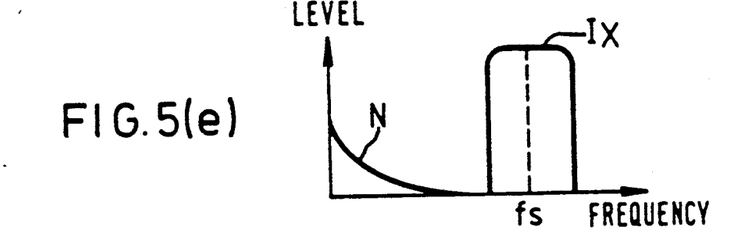

The noise signal N, as shown in FIG. 5(d), is applied to the signal processing circuit 72x together with the modulated signal, as shown in FIG. 5(c). Therefore, a signal Cx, as shown in FIG. 5(e), is applied to the signal processing circuit 72x. As shown in FIG. 5(e), the signal Cx comprises a component shown by Graph N corresponding to the noise signal N and a component shown by Graph Ix corresponding to the modulated signal Ix. This signal Cx corresponds to the first common subtraction signal C in FIG. 3. The signal processing circuit 72x carries out the integration signal Dx is output from the signal processing circuit 72x. The integration signal Dx corresponds to the first common integration signal D in FIG. 3. The integration signal Dx is applied to a second multiplication circuit 82x. The second multiplication circuit 82x corresponds to the second switching circuit 82 in FIG. 3. The clock signal G is also applied to the second multiplication circuit 82x. Thus, the second multiplication circuit 82x multiplies the integration signal Dx with the clock signal G.

Figure 5F:
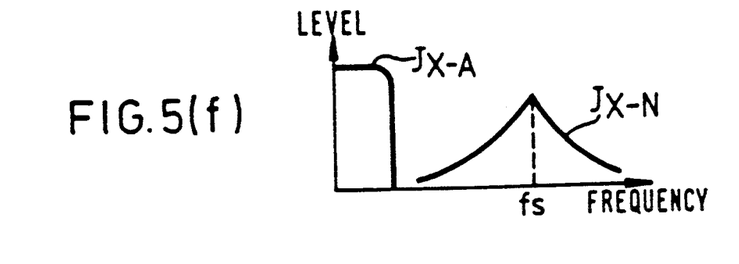

Now, assuming that the integration signal Dx is identical to the signal Cx with respect to frequency response characteristic, then, the integration signal Dx is also shown by the graph of FIG. 5(e). According to the multiplication by the second multiplication circuit 82x, the component N in the lower frequency band is modulated by the clock signal G. On the other hand, the component Ix is demodulated by the clock signal G. This is so because the component Ix is the component modulated with priority by the first multiplication circuit 81x. As a result, a signal Jx, as shown in FIG. 5(f), is obtained from the second multiplication circuit 82x.

The signal Jx corresponds to the second common subtraction signal J in the A/D converter of FIG. 3. In FIG. 5(f), Graph Jx-A shows a component demodulated from the component Ix of the integration signal Dx and Graph Jx-N shows a component modulated from the noise signal N of FIG. 5(e). As shown in FIG. 5(f), the component Jx-A is returned to the low frequency band originally occupied by the analog signal A. On the other hand, the component Jx-N is shifted to the higher frequency band around the frequency fs of the clock signal G.

The signal Jx, i.e., the second common substraction signal J obtained from the first and second output terminals 82c and 82d is applied to the quantizer 75 of FIG. 3 through the second integrator 74. The component Jx-N as well as the component Jx-A in the signal J or the second common integration output signal F is quantized by the quantizer 75. Thus, the quantization signal H output from the quantizer 75 includes a high frequency component H-N responding to the component Jx-N.

However, the high frequency component H-N in the quantization signal H can be easily removed by a low pass filter. Such a low pass filter is generally provided for the A/D converter. As a result, the quantization signal H has a good S/N ratio.

In such an A/D converter, power sources also introduce a power source noise into the circuit. However, all of the circuit blocks in the first embodiment of the A/D converter, as shown in FIG. 3, are constituted by a differential circuit version. That is, each of the first and second integrators 72 and 74 and the quantizer 75 has a pair of signal flow-paths which are differentially related to each other. The power source noise is applied to the differentially related signal flow-paths at the same phase. As a result, the power source noise is eliminated in each of the circuit blocks. Thus, the first embodiment of the A/D converter reduces the effect of power source noise as well as that of thermal noise.

In the first embodiment of the A/D converter, as shown in FIG. 3, the third switching circuit 83 does not participate in such a noise reduction operation. The third switching circuit 83, however, carries out a matching operation between phases of the signals I and D applied to the subtraction circuits 71a, 71b, 73a and 73b and the feedback signal B.

Figure 6:
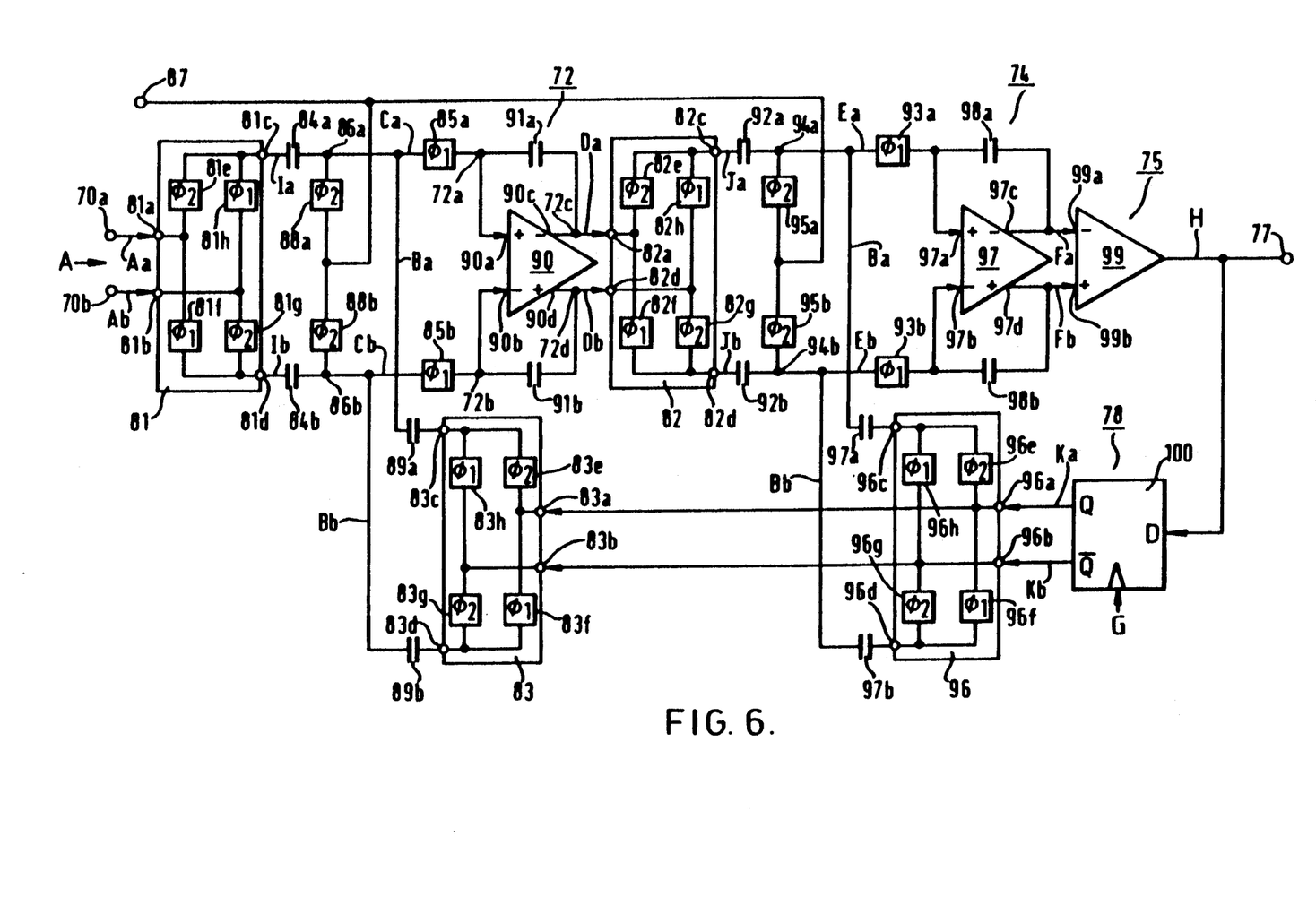
FIG. 6 is a block diagram showing a second embodiment of a Δ−Σ modulation A/D converter according to the present invention.

Referring now to FIG. 6, a second embodiment of the A/D converter of FIG. 3 will be described. The embodiment of FIG. 6 is comprised of a switched capacitor integration circuit. In FIG. 6, an analog signal A to be quantized is applied across first and second input terminals 70a and 70b. Thus, differentially related signals Aa and Ab of the analog signal A occur on the terminals 70a and 70b. The differentially related signals Aa and Ab are applied to a first switching circuit 81. The first switching circuit 81 has a circuit construction the same as the switching circuits 81, 82 and 83 of FIG. 3. The switching operation of the first switching circuit 81 is controlled by a clock signal G, similar to the first embodiment of FIG. 3. That is, the clock signal G is comprised of two signals $\phi 1$ and $\phi 2$, the same as the first and second phase clock signals $\phi 1$ and $\phi 2$ referred in above. The first and second phase clock signals $\phi 1$ and $\phi 2$ are supplied from a clock generator the same as the clock generator 76 of FIG. 3. In FIG. 6, however, the clock generator is not shown for the simplicity.

In the first switching circuit 81, the analog signal A is multiplied with the clock signal G. Thus, differentially related signals Ia and Ib of a multiplication output signal I are obtained from first and second output terminals 81c and 81d of the first switching circuit 81. The differential signals Ia and Ib are applied to a first integrator 72 through coupling capacitors 84a and 84b and switches 85a and 85b, respectively. Each of connection nodes 86a and 86b between the coupling capacitors 84a and 84b and the switches 85a and 85b are coupled to a power source 87 through switches 88a and 88b. Now, it is assumed that all switches referred in the following description as well as the switches 85a, 85b, 88a and 88b are controlled by the clock signal G. For example, the switches 88a and 88b are turned ON when the second phase clock signal $\phi 2$ is in the H level, while the switches 85a and 85b are turned OFF at the time. The switches 85a and 85b are turned ON when the first phase clock signal $\phi 1$ is in the H level, while the switches 88a and 88b are turned OFF at the time.

The connection nodes 86a and 86b are also connected to first and second output terminals 83c and 83d of a third switching circuit 83 through coupling capacitors 89a and 89b. The third switching circuit 83 also has a circuit construction the same as the switching circuits 81, 82 and 83 of FIG. 3. The differential signals Ia and Ib output from the first switching circuit 81 are substracted with differential feedback signals Ba and Bb output from the third feedback switching circuit 82 at the connection nodes 86a and 86b. That is, differentially related subtraction signals Ca and Cb are obtained at the connection nodes 86a and 86b.

The differential subtraction signals Ca and Cb are applied to the first integrator 72. The first integrator 72 is comprised of an operational amplifier 90 and a pair of integration capacitors 91a and 91b, like conventional switched capacitor type integrators. That is, non-inversed and inversed input terminals 90a and 90b of the operational amplifier 90 are coupled to the inversed and non-inversed input terminals 72a and 72b. Inversed and non-inversed output terminals 90c and 90d of the operational amplifier 90 are coupled to the inversed and non-inversed input terminals 72c and 72d. Further, the inversed and non-inversed output terminals 90c and 90d are coupled to the non-inversed and inversed input terminals 72a and 72b through the integration capacitors 91a and 91b, respectively. Thus, the differential subtraction signals Ca and Cb are input to the non-inversed and inversed input terminals 90a and 90b of the operational amplifier 90.

The charge integrations of the integration capacitors 91a and 91b are switched by the switches 85a and 85b at the frequency of the clock signal G. Thus, the first integrator 72 carries out integrating operations for the differential subtraction signals Ca and Cb input to the circuit.

First integration signal D obtained from the first integrator 72 is applied to the second switching circuit 82. The second switching circuit 82 has a circuit construction the same as the switching circuits 81, 82 and 83 of FIG. 3. Therefore, the switching operation of the second switching circuit circuit 82 is controlled by the clock signal G, similar to the switching circuits 81, 82 and 83 of FIG. 3.

In the second switching circuit 82, the first integration signal D is multiplied with the clock signal G. Thus, differentially related signals Ja and Jb of a multiplication output signal J are obtained from first and second output terminals 82c and 82d of the second switching circuit 82. The differential signals Ja and Jb are applied to a second integrator 74 through coupling capacitors 92a and 92b and switches 93a and 93b, respectively. Each of connection nodes 94a and 94b between the coupling capacitors 92a and 92b and the switches 93a and 93b are coupled to the power source 87 through switches 95a and 95b. The switches 95a and 95b are turned ON when the second phase clock signal $\phi 2$ is in the H level, while the switches 93a and 93b are turned OFF at the time. The switches 93a and 93b are turned ON when the first phase clock signal $\phi 1$ is in the H level, while the switches 95a and 95b are turned OFF at the time.

The connection nodes 94a and 94b are also connected to first and second output terminals 96c and 96d of a fourth switching circuit 96 through coupling capacitors 97a and 97b. The fourth switching circuit 96 also has a circuit construction the same as the switching circuits 81, 82 and 83 of FIG. 3. The fourth switching circuit 96 is connected to a delay circuit 78 in parallel with the third switching circuit 83. Thus, the fourth switching circuit 96 outputs the feedback signal B the same as the third switching circuit 83. The third and fourth switching circuits 83 and 96 are provided for avoiding couplings between the connection nodes of 86a, 86b and 94a, 94b. The differential signals Ja and Jb output from the second switching circuit 82 are substracted with the differential feedback signals Ba and Bb output from the fourth feedback switching circuit 96 at the connection nodes 94a and 94b. That is, differentially related subtraction signals Ea and Eb are obtained at the connection nodes 94a and 94b.

The differential subtraction signals Ea and Eb are applied to the second integrator 74. The second integrator 74 has a circuit construction the same as the first integrator 72. That is, the second integrator 74 is comprised of an operational amplifier 97 and a pair of integration capacitors 98a and 98b. Thus, the differential subtraction signals Ea and Eb are input to the non-inversed and inversed input terminals 97a and 97b of the operational amplifier 97.

The charge integrations of the integration capacitors 98a and 98b are switched by the switches 93a and 93b at the frequency of the clock signal G. Thus, the second integrator 74 carries out integrating operations for the differential subtraction signals Ea and Eb input to the circuit.

Second integration signal F obtained from the second integrator 74 is applied to a quantizer 75. The quantizer 75 consists of a comparator 99, like conventional quantizing circuits. Differentially related signals Fa and Fb of the second integration signal F are applied to inversed and non-inversed input terminals 99a and 99b of the comparator 99. The comparator 99 compares the differential signals Fa and Fb at the frequency of the clock signal G. As a result, the second integration signal F is sampled at a rate of the frequency of the clock signal G. A sampled instantaneous signal value of the second integration signal F obtained by the comparator 99, i.e., the quantizer 75 is output to an output terminal 77 as a quantization signal H of the analog signal A, as described before.

The sampled instantaneous signal value is applied to the delay circuit 78 to obtain the above-mentioned feedback signal B. The delay circuit 78 consists of a flip-flop 100, like conventional delay circuits. The quantization signal H obtained from the quantizer 75 is applied to the D-input terminal of the flip-flop 100. The flip-flop 100 carries out a flip-flop operation at the frequency of the clock signal G. Thus, a signal K delayed from the input quantization signal H for the one sampling period is output from the flip-flop 100. That is, differentially related signals Ka and Kb of the delayed signal K are obtained from the Q-output and $\overline{Q}$-output terminals of the flip-flop 100, respectively.

The delayed signal K is applied to both the third and fourth switching circuits 83 and 96. That is, the differential delayed signals Ka and Kb are applied to first and second input terminals 96a and 96b of the fourth switching circuit 96, as well as to first and second input terminals 83a and 83b of the third switching circuit 83. Then, fifth and sixth switching output signals are obtained from first and second output terminals 96c and 96d of the fourth switching circuit 96, as well as first and second output terminals 83c and 83d of the third switching circuit 83. The fifth switching output signal is applied to the connection nodes 86a and 94a as the first feedback signal Ba. The sixth switching output signal is applied to the connection nodes 86b and 94b as the second feedback signal Bb.

The differential feedback signals Ba and Bb of the feedback signal B are fed back in the signal flow-path including the first and second integrators 72 and 74 and the quantizer 75. Thus, the sampled instantaneous signal value obtained by the quantizer 75 is integrated, re-sampled and again integrated to reduce quantizing noise in the feedback loop. As a result, the quantization output H obtained from the quantizer 75 is converted to a one bit digital signal version.

According to the A/D converter with the switched capacitor integration circuit, as shown in FIG. 6, the quantization signal H also has a good S/N ratio in respect to internal noise, such as the thermal noise produced in the integrators. The A/D converter also has a good noise reduction characteristic for power source noise introduced by the power source.

In the A/D converter of FIG. 6, the capacitors in each pair are set to have the same capacitance with each other. The output level of the quantization signal H can be adjusted by relations or ratios among the capacitors 84a (84b), 89a (89b), 91a (91b), 92a (92b), 97a (97b) and 99a (99b).

Figure 7:
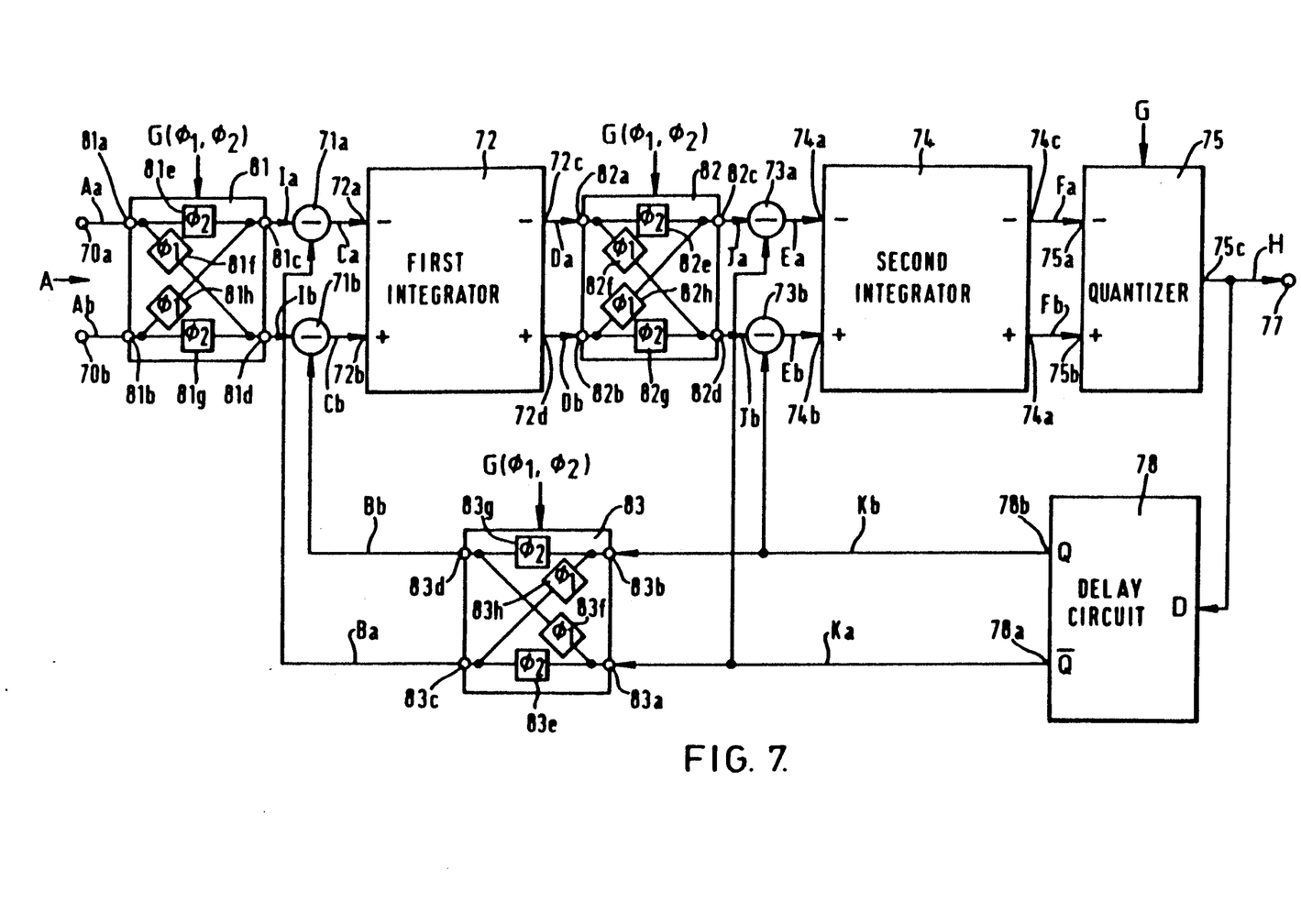
FIG. 7 is a block diagram showing a third embodiment of a Δ−Σ modulation A/D converter according to the present invention.

Referring now to FIG. 7, a third embodiment of the $\Delta - \Sigma$ modulation A/D converter according to the present invention will be described in brief. The third embodiment of the A/D converter has a construction different from the first embodiment, as shown in FIG. 3, in respect to locations of the second switching circuit 82 and the third and fourth subtractors 73a and 73b. That is, the locations of the second switching circuit 82 and the third and fourth subtractors 73a and 73b are changed to each other.

According to the location change, the delayed signals Ka and Kb obtained from the delay circuit 78 are directly applied to the third and fourth subtractors 73a and 73b. This is because the delayed signals Ka and Kb have phases the same as the switching output signals Ja and Jb to be applied to the third and fourth subtractors 73a and 73b. On the other hand, the first and second subtractors 71a and 71b are supplied with the feedback signals Ba and Bb through the third switching circuit 83. Therefore, the feedback signals Ba and Bb and the switching output signals Ia and Ib to be applied to the first and second subtractors 71a and 71b maintain their phase relation the same as the first embodiment.

According to the third embodiment, the first and second subtractors 71a and 71b and the first integrator 72 are encompassed with by the first and second switching circuits 81 and 82. Thus, internal noise produced in the first and second subtractors 71a and 71b and the first integrator 72 is reduced, according to the same reason as described in the first embodiment.

Figure 8:
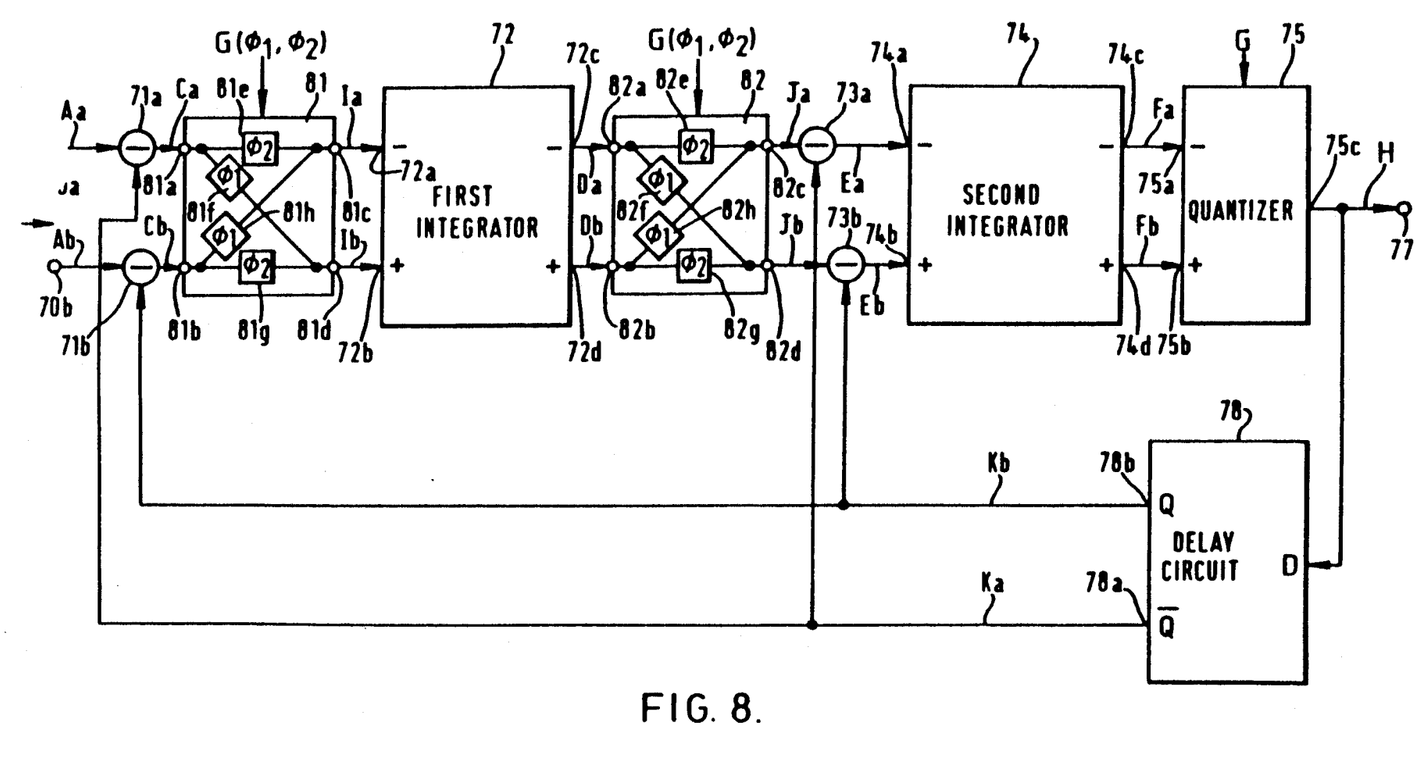
FIG. 8 is a block diagram showing a fourth embodiment of a Δ−Σ modulation A/D converter according to the present invention.

Referring now to FIG. 8, a fourth embodiment of the $\Delta - \Sigma$ modulation A/D converter according to the present invention will be described in brief. The fourth embodiment of the A/D converter has a construction different from the third embodiment, as shown in FIG. 7, in respect to locations of the first switching circuit 81 and the first and second subtractors 71a and 71b. That is, locations of the first switching circuit 81 and the first and second subtractors 71a and 71b are changed with respect to each other.

According to the location change, the delayed signals Ka and Kb obtained from the delay circuit 78 are directly applied to the first and second subtractors 71a and 71b. This is so because the delayed signals Ka and Kb have phases the same as the differential analog signals Aa and Ab to be applied to the first and second subtractors 71a and 71b. Thus, the fourth embodiment does not need any switching circuit in the feedback path.

According to the fourth embodiment, only the first integrator 72 is encompassed by the first and second switching circuits 81 and 82. Thus, internal noise produced in the first integrator 72 is reduced, according to the same reason as described in the first embodiment.

Figure 9:
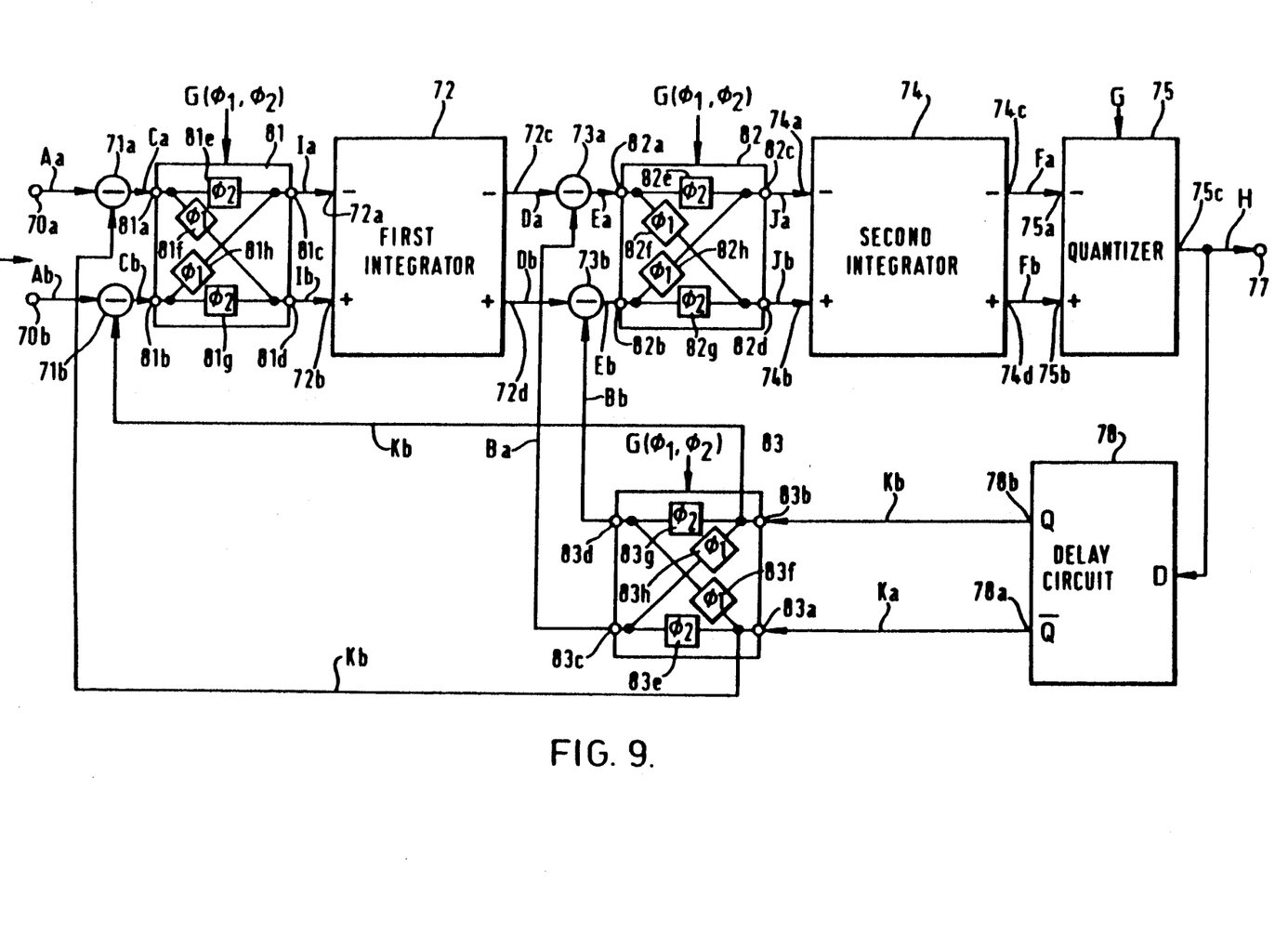
FIG. 9 is a block diagram showing a fifth embodiment of a Δ−Σ modulation A/D converter according to the present invention.

Referring now to FIG. 9, a fifth embodiment of the $\Delta - \Sigma$ modulation A/D converter according to the present invention will be described in brief. The fifth embodiment of the A/D converter has a construction different from the first embodiment, as shown in FIG. 3, with respect to locations of the first switching circuit 81 and the first and second subtractors 71a and 71b. That is, the locations of the first switching circuit 81 and the first and second subtractors 71a and 71b are changed with respect to each other.

According to the location change, the delayed signals Ka and Kb obtained from the delay circuit 78 are directly applied to the first and second subtractors 71a and 71b. This is so because the delayed signals Ka and Kb have phases the same as the differential analog signals Aa and Ab to be applied to the first and second subtractors 71a and 71b. On the other hand, the third and fourth subtractors 73a and 73b are supplied with the feedback signals Ba and Bb through the third switching circuit 83. Therefore, the feedback signals Ba and Bb and the differential integration output signals Da and Db to be applied to the third and fourth subtractors 73a and 73b maintain their phase relation the same as the first embodiment.

According to the fifth embodiment, the first integrator 72 and the third and fourth subtractors 73a and 73b and are encompassed by the first and second switching circuits 81 and 82. Thus, internal noise produced in the first integrator 72 and the third and fourth subtractors 73a and 73b is reduced, according to the same reason as described in the first embodiment.

As described above, the present invention can provide an extremely preferable delta-sigma modulation analog to digital converter.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A delta-sigma modulation analog to digital converter for converting an analog input signal to a digital output signal, comprising:

input means for receiving the analog input signal;

clock generator means for generating a very high frequency clock signal with first and second phases;

first switching circuit means, coupled to the input means, for modulating the analog input signal with the very high frequency clock signal;

integration means, coupled to the first switching circuit means, for integrating the modulated input signal, the integration means also generating a noise signal;

second switching circuit means, coupled to the integration means, both for demodulating the integrated modulated input signal and modulating the noise signal with the very high frequency clock signal;

quantizer means, coupled to the second switching circuit means and responsive to the demodulated integrated modulated input signal and the modulated noise signal, for generating the digital output signal, the digital output signal including a separable portion corresponding to the modulated noise signal; and feedback circuit means, coupled between the quantizer means and the integration means, for both generating a feedback signal corresponding to the digital output signal and feeding the feedback signal to the integration means.

2. The converter of claim 1 wherein the input means includes inversed and non-inversed phase input terminals and the integration means and the quantizer means have inversed and non-inversed phase input and output terminals.

3. The converter of claim 2 wherein the first and second switching circuit means each includes four switches, a first pair of the switches corresponding to the first phase of the clock signal and a second pair of the switches corresponding to the second phase of the clock signal.

4. The converter of claim 3 wherein the first pair of the switches is coupled between inversed phase input terminals, the other switch of the first pair of the switches is coupled between non-inversed phase input terminals and the second pair of the switches is coupled between one inversed phase input terminal and one non-inversed phase input terminal.

5. The converter of claim 2 wherein the feedback circuit means includes subtraction means for subtracting one from the other between the analog input signals and the feedback signals.

6. The converter of claim 5 wherein the subtraction means is coupled between the input means and the first switching circuit means.

7. The converter of claim 5 wherein the subtraction means is coupled between the first switching circuit means and the integration means.

8. The converter of claim 7 wherein the feedback circuit means includes third switching circuit means for matching the phase of the feedback signal to the phase of the analog input signal.

9. The converter of claim 1 wherein the feedback circuit means further includes a second subtraction means for subtracting one from the other between the integrated input signal output from the first integration means and the feedback signals.

10. The converter of claim 9 wherein the first subtraction means is coupled between the input means and the first switching circuit means.

11. The converter of claim 10 wherein the second subtraction means is coupled between the first integration means and the second switching circuit means.

12. The converter of claim 11 wherein the feedback circuit means includes third switching circuit means for matching the phase of the feedback signal to the phase of the integrated input signal output from the first integration means.

13. The converter of claim 9 wherein the first subtraction means is coupled between the first switching circuit means and the first integration means.

14. The converter of claim 13 wherein the feedback circuit means includes third switching circuit means for matching the phase of the feedback signal to the phase of the analog input signal.

15. The converter of claim 13 wherein the second subtraction means is coupled between the first integration means and the second switching circuit means.

16. The converter of claim 15 wherein the feedback circuit means includes third switching circuit means for matching the phase of the feedback signal to the phases of the analog input signal and the integrated input signal output from the first integration means.

* * * * *